(12) United States Patent
Yoshida (10) Patent No.: US 10,608,098 B1
(45) Date of Patent: Mar. 31, 2020

(54) SEMICONDUCTOR MEMORY DEVICE AND METHOD OF MANUFACTURING SEMICONDUCTOR MEMORY DEVICE

(71) Applicant: TOSHIBA MEMORY CORPORATION, Minato-ku (JP)

(72) Inventor: Kiyomitsu Yoshida, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/270,783

(22) Filed: Feb. 8, 2019

(30) Foreign Application Priority Data

Sep. 13, 2018 (JP) .................................. 2018-171057

(51) Int. Cl.
| | |
|---|---|
| *H01L 29/51* | (2006.01) |
| *H01L 27/11556* | (2017.01) |
| *H01L 27/11582* | (2017.01) |
| *H01L 21/8234* | (2006.01) |
| *H01L 27/11575* | (2017.01) |
| *H01L 27/11548* | (2017.01) |

(52) U.S. Cl.
CPC .... *H01L 29/515* (2013.01); *H01L 21/823437* (2013.01); *H01L 21/823487* (2013.01); *H01L 27/11548* (2013.01); *H01L 27/11556* (2013.01); *H01L 27/11575* (2013.01); *H01L 27/11582* (2013.01)

(58) Field of Classification Search
CPC ......... H01L 27/11582; H01L 27/11556; H01L 29/515
See application file for complete search history.

(56) References Cited

U.S. PATENT DOCUMENTS

| | | | | |
|---|---|---|---|---|
| 9,166,032 | B1 * | 10/2015 | Higuchi | ............. H01L 21/0262 |
| 9,691,884 | B2 * | 6/2017 | Makala | ............. H01L 27/11524 |
| 9,818,760 | B1 * | 11/2017 | Lai | .................... H01L 27/11582 |
| 9,929,043 | B2 | 3/2018 | Ito et al. | |
| 9,929,169 | B2 | 3/2018 | Arai | |
| 2017/0047341 | A1 | 2/2017 | Arai | |

* cited by examiner

*Primary Examiner* — Jose R Diaz
(74) *Attorney, Agent, or Firm* — Oblon, McClelland, Maier & Neustadt, L.L.P.

(57) ABSTRACT

A semiconductor memory device according to an embodiment includes a slit-side end portion of an insulating layer includes a main body of the insulating layer, a first thin layer thinner than the main body and extending from an end portion closer to an upper surface of the main body, the end portion facing the slit, toward the slit, and a second thin layer thinner than the main body and extending from an end portion closer to a lower surface of the main body, the end portion facing the slit, toward the slit, and the insulating layer includes an air gap layer surrounded by the main body, the first thin layer, and the second thin layer in the slit-side end portion.

20 Claims, 9 Drawing Sheets

SEMICONDUCTOR MEMORY DEVICE AND METHOD OF MANUFACTURING SEMICONDUCTOR MEMORY DEVICE

CROSS-REFERENCE TO RELATED APPLICATIONS

This application is based upon and claims the benefit of priority from Japanese Patent Application No. 2018-171057, filed on Sep. 13, 2018; the entire contents of which are incorporated herein by reference.

FIELD

Embodiments described herein relate generally to a semiconductor memory device and a method of manufacturing a semiconductor memory device.

BACKGROUND

In a three-dimensional nonvolatile memory, a plurality of memory cells is arrayed along a height direction of a pillar on a side surface of the pillar extending in a height direction. In the three-dimensional nonvolatile memory, improvement of a signal speed in word lines stacked in the height direction of the pillar is desired.

DETAILED DESCRIPTION

A semiconductor memory device according to an embodiment includes a stacked body having a plurality of conductive layers and at least one insulating layer alternately stacked above a substrate, a plurality of pillars extending in a stacking direction of the stacked body to penetrate the stacked body, a plurality of memory cells arrayed in a height direction of the pillars, and a slit extending in the stacking direction of the stacked body to penetrate the stacked body, outside a region where the pillars are arranged, wherein an end portion of the insulating layer on a side of the slit has a main body of the insulating layer, a first thin layer thinner than the main body and extending from an end portion closer to an upper surface of the main body, the end portion facing the slit, toward the slit, and a second thin layer thinner than the main body and extending from an end portion closer to a lower surface of the main body, the end portion facing the slit, toward the slit, a connection end of the first thin layer, the connection end being connected with the main body, and a connection end of the second thin layer, the connection end being connected with the main body, are separated in the stacking direction of the stacked body, a tip end portion of the first thin layer, the tip end portion extending toward the slit, and a tip end portion of the second thin layer, the tip end portion extending toward the slit, are in contact with each other, and the insulating layer includes an air gap layer surrounded by the main body, the first thin layer, and the second thin layer, in the end portion on the side of the slit.

Hereinafter, an embodiment of the present invention will be described in detail with reference to the drawings. Note that the present invention is not limited by the following embodiment. Further, constituent elements in the following embodiment include those easily assumed by a person skilled in the art or those substantially the same.

A semiconductor memory device and processing of manufacturing the semiconductor memory device according to an embodiment will be described with reference to FIGS. 1 to 9.

[Configuration Example of Semiconductor Memory Device]

Figure 1:
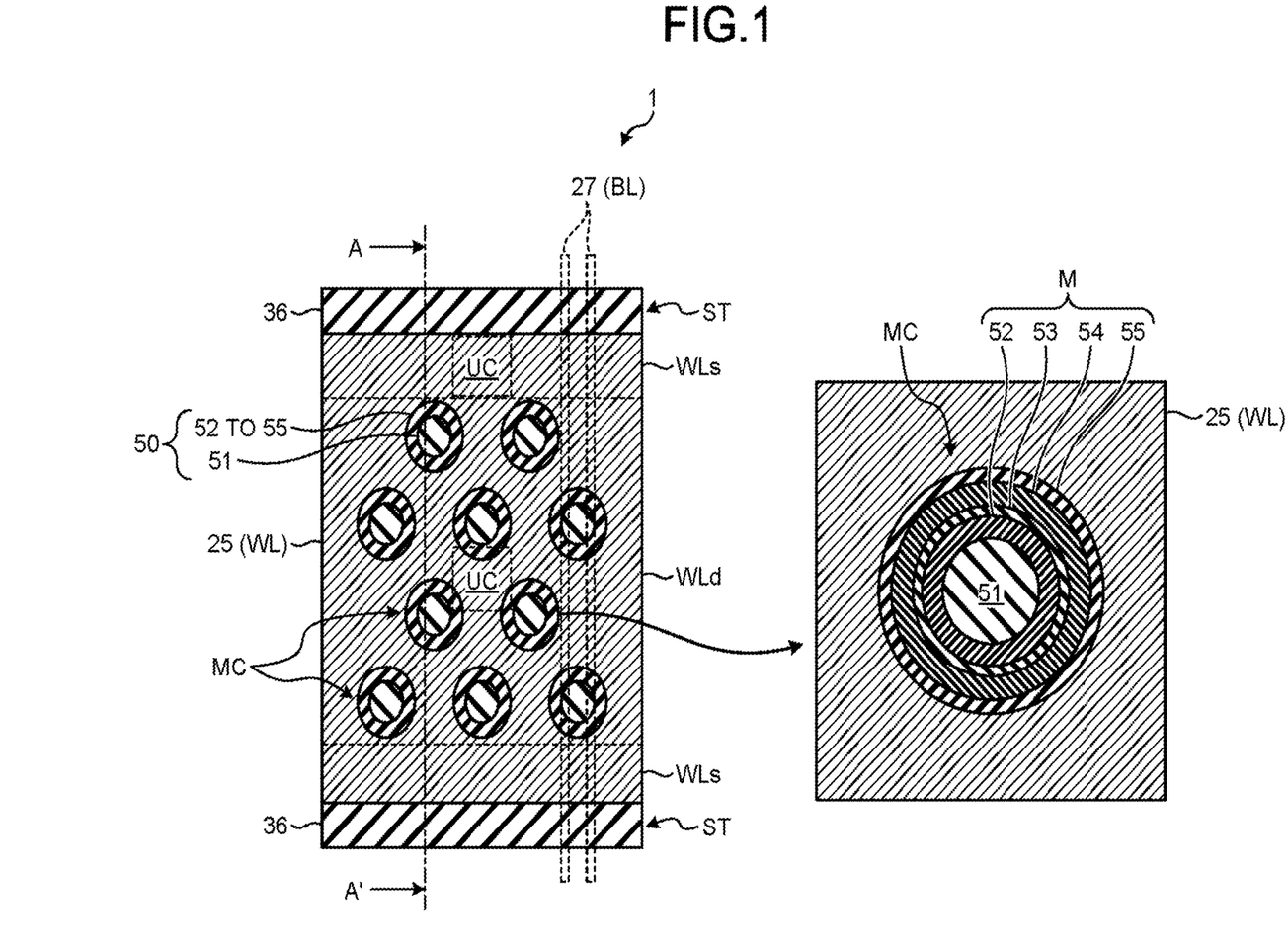
FIG. 1 is a cross-sectional view along one of conductive layers and an enlarged view of a vicinity of a columnar structure of a semiconductor memory device according to an embodiment.
Figure 2:
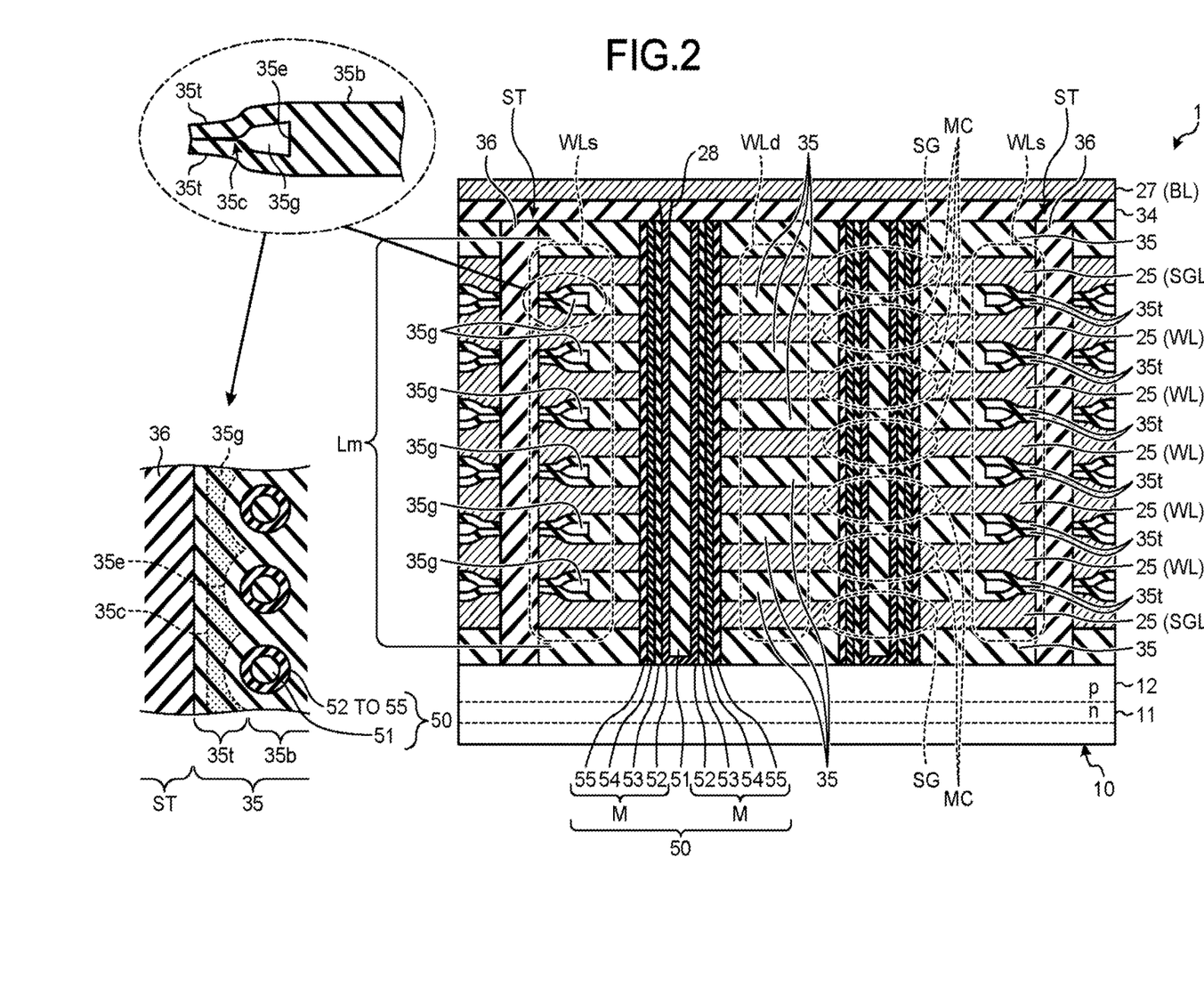
FIG. 2 is a cross-sectional view in a stacking direction of the semiconductor memory device according to the embodiment at a position taken along line A-A' in FIG. 1.

FIG. 1 is a cross-sectional view along one of conductive layers 25 and an enlarged view of a vicinity of a columnar structure 50 of a semiconductor memory device 1 according to an embodiment. Note that FIG. 1 illustrates only two of bit lines BL. FIG. 2 is a cross-sectional view in a stacking direction of the semiconductor memory device 1 according to the embodiment at a position taken along line A-A' in FIG. 1.

As illustrated in FIGS. 1 and 2, the semiconductor memory device 1 of the embodiment is formed as a NAND-type flash memory having, for example, a three-dimensional structure on a semiconductor substrate 10 such as a silicon substrate. The semiconductor substrate 10 has an n well 11 in a surface layer portion and a p well 12 in the n well 11. Note that the semiconductor memory device 1 may be formed on a conductive layer functioning as a source line, instead of directly on a substrate such as the semiconductor substrate 10.

A stacked body Lm in which a plurality of insulating layers 35 and a plurality of conductive layers 25 are alternately stacked is formed on the semiconductor substrate 10. The insulating layer 35 is, for example, an $SiO_2$ layer, and the conductive layer 25 is, for example, a W layer.

The stacked body Lm is divided into a plurality of stacked body portions by a plurality of slits ST. The slit ST that divides the stacked body Lm extends in a stacking direction of the stacked body Lm to penetrate the stacked body Lm. For example, an insulating layer 36 is buried in the slit ST.

A plurality of columnar structures 50 extending in the stacking direction of the stacked body Lm are provided in a matrix manner to penetrate the stacked body Lm in a region that is a stacked body portion of the stacked body Lm sandwiched by the two slits ST. The columnar structure 50 is formed in, for example, a substantially circular shape in top view. However, the columnar structure 50 may be formed in, for example, a substantially elliptical shape in top view. The plurality of columnar structures 50 is arranged in, for example, a staggered manner in top view. However, the plurality of columnar structures 50 may be arranged in, for example, a square grid manner in top view.

The columnar structure 50 includes a core portion 51 as a pillar. A plurality of layers is formed on a side wall of the core portion 51 to enclose the side wall of the core portion 51. These layers are, in order from a side of the core portion 51, a channel layer 52, a tunnel insulating layer 53, a charge accumulation layer 54, and a block insulating layer 55. The channel layer 52 also covers a bottom surface of the core portion 51. The core portion 51 contains, for example, $SiO_2$ as a main component. The channel layer 52 is, for example, a polysilicon layer. The charge accumulation layer 54 is, for example, a SiN layer. The tunnel insulating layer 53 and the block insulating layer 55 are, for example, $SiO_2$ layers. Note that the charge accumulation layer 54 may be a floating gate having conductivity, the periphery of the floating gate being covered with an insulating layer.

Each of both end portions of the stacked body Lm sandwiched by the two slits ST, that is, the insulating layer 35 proximity to the slit ST includes an air gap layer 35g in the layer. Specifically, an end portion of the insulating layer 35 on the side of the slit ST has a main body 35b and two thin layers 35t and 35t thinner than the main body 35b. The main body 35b has an end portion 35e facing the slit ST. The two thin layers 35t and 35t extend from the end portion 35e of the main body 35b toward the slit ST. A connection end of one thin layer 35t, the connection end being connected with the main body 35b, is connected closer to an upper end surface of the end portion 35e of the main body 35b, and a connection end of the other thin layer 35t, the connection end being connected with the main body 35b, is connected closer to a lower surface of the end portion 35e of the main body 35b. With the structure, the connection ends of the two thin layers 35t and 35t, the connection ends being connected with the main body 35b, are spaced across the main body 35b with a predetermined distance in the stacking direction of the stacked body Lm. Tip end portions of the two thin layers 35t and 35t, the tip end portions extending toward the slits ST, are in contact with each other. The tip end portions of the two thin layers 35t and 35t may be in plane contact with each other or may be in point contact or line contact with each other. Further, the tip end portions of the thin layers 35t and 35t are in contact with each other at a position sandwiched by the conductive layers 25 adjacent in the stacking direction of the stacked body Lm without entering the slit ST. Note that, whereas the main body 35b of the insulating layer 35 is located inside and outside a region where the columnar structure 50 is arranged, the tip end portions in contact with each other at a position sandwiched by the adjacent conductive layers 25 in the two thin layers 35t and 35t correspond to a peripheral edge portion of the insulating layer 35 in particular.

Further, the two thin layers 35t and 35t are separated without being in contact with each other in the stacking direction of the stacked body Lm, in portions other than the tip end portions corresponding to the peripheral edge portion of the insulating layer 35. With the configuration, the air gap layer 35g surrounded by the end portion 35e of the main body 35b and the two thin layers 35t and 35t is configured within the insulating layer 35. Further, since the tip end portions of the two thin layers 35t and 35t are in contact with each other, an interval between the two insulating layers 35 adjacent in the stacking direction of the stacked body Lm expands toward the side of the slit ST. With the configuration, the conductive layer 25 on the side of the slit ST of the stacked body Lm occupies a space between the insulating layers 35, the space expanding toward the side of the slit ST, and is thicker than the conductive layer 25 in the region where the columnar structure 50 is provided near the center of the stacked body Lm.

FIG. 2 further illustrates an enlarged perspective plan view of the air gap layer 35g. As illustrated in the enlarged perspective plan view of FIG. 2, the end portion 35e of the main body 35b, the end portion 35e being the connection ends of the thin layers 35t and 35t with the main body 35b, has a wave shape in which arcs along an outer periphery of a row of the columnar structures 50 proximity to the slit ST lie in a row in top view. That is, the end portion 35e of the main body 35b is arranged with a substantially equal distance from the outer periphery of each columnar structure 50. Further, a blocked end 35c of the air gap layer 35g formed as the tip end portions of the thin layers 35t and 35t are in contact with each other has a substantially linear shape along an edge of the slit ST in top view.

Note that, in the example of FIG. 2, the uppermost and lowermost insulating layers 35 do not have the air gap layer 35g. However, the uppermost and lowermost insulating layers 35 may have the air gap layer 35g.

The semiconductor memory device 1 further includes a conductive layer 27 extending in a substantially horizontal direction to a main surface of the semiconductor substrate 10, above the stacked body Lm of the insulating layers 35 and the conductive layers 25. An insulating layer 34 lies between the stacked body Lm and the conductive layer 27. The channel layer 52 included in the columnar structure 50 and the conductive layer 27 are connected by a contact 28 penetrating the insulating layer 34. More specifically, a predetermined conductive layer 27 of a plurality of the conductive layers 27 is connected with the channel layer 52 of a predetermined columnar structure 50.

[Functions of Semiconductor Memory Device]

Next, functions of the semiconductor memory device 1 as a three-dimensional NAND-type flash memory will be described with reference to FIGS. 1 and 2.

At least a part of the channel layer 52, the tunnel insulating layer 53, the charge accumulation layer 54, and the block insulating layer 55 of the columnar structure 50 function as a memory cell MC. The channel layer 52, the tunnel insulating layer 53, the charge accumulation layer 54, and the block insulating layer 55 can also be said to be a memory layer M constituting the memory cell MC. The memory cells MC are arranged at respective heights of the plurality of stacked conductive layers 25. That is, in the columnar structure 50, a plurality of the memory cells MC is arranged along a height direction of the columnar structure 50. These memory cells MC function as a memory string lying on the side surface of one core portion 51.

A portion of the stacked conductive layers 25, the portion being in contact with at least the side surface of the columnar structure 50 and a vicinity of the portion function as a control gate electrode of the memory cell MC. A portion of each conductive layer 25 sandwiched by the two slits ST that divide the stacked body Lm extends along the slits ST as a word line WL. Individual memory cells MC are respectively associated with word lines WL at the same heights.

Note that the uppermost and lowermost conductive layers 25, of the plurality of conductive layers 25, function as selection gate lines SGL. The selection gate line SGL is used to select a predetermined memory string from among memory strings commonly connected to one bit line BL to be described below. Further, the channel layer 52, the tunnel insulating layer 53, the charge accumulation layer 54, and the block insulating layer 55 associated with the selection gate line SGL function as a selection transistor SG. When the selection transistor SG is turned ON or OFF, a predetermined memory string is brought into a selected state or a non-selected state.

The slits ST outside the memory cells MC arranged in a matrix manner are used at the time of processing of manufacturing the semiconductor memory device 1, as will be described below. For example, the insulating layer 36 is buried in the slit ST in a state where the manufacturing processing is completed, as described above. Note that, after used in the manufacturing processing, the slit ST may be used as a source line contact in the semiconductor memory device 1, for example, by burying a plate-like conductive layer in the slit ST via a liner-like insulating layer. The conductive layers 27 arranged above the memory cell MC function as the bit lines BL.

Meanwhile, the word line WL and the selection gate line SGL near the slit ST have a low resistance band WLs as a band-like portion extending in a band-like manner along the slit ST. The columnar structure 50 does not exist in the low resistance band WLs, and the word line WL and the selection gate line SGL of the low resistance band WLs have a wide band-like area in top view. In other words, the columnar structure 50 does not exist in the low resistance band WLs, and there is no obstacle to impede a current flow in the word line WL and the selection gate line SGL. Therefore, the word line WL and the selection gate line SGL of the low resistance band WLs are relatively low in resistance.

On the other hand, the word line WL and the selection gate line SGL near the center of the stacked body Lm have a mesh-like high resistance band WLd dotted with the columnar structures 50. The high resistance band WLd is divided in a mesh-like manner due to the densely arranged columnar structures 50 and does not have a substantial large area in top view. In other words, in the high resistance band WLd, the densely arranged columnar structures 50 may be a factor to impede the current flow in the word line WL and the selection gate line SGL. Therefore, the word line WL and the selection gate line SGL of the high resistance band WLd are relatively high in resistance.

Comparing the areas of the word line WL and the selection gate line SGL per unit section UC in top view between the low resistance band WLs and the high resistance band WLd, it can be more easily understood that the low resistance band WLs has a lower resistance than the high resistance band WLd. In other words, the area of the word line WL and the selection gate line SGL per unit section UC in top view in the low resistance band WLs is larger than the area of the word line WL and the selection gate line SGL per unit section UC in top view in the high resistance band WLd.

[Operation of Semiconductor Memory Device]

An operation example of the semiconductor memory device 1 will be ongoingly described with reference to FIGS. 1 and 2.

When writing "0" data (for example, "H" level data) to the memory cell MC, a write voltage is applied to the word line WL connected to the memory cell MC. Meanwhile, the memory cell MC includes the channel layer 52 connected to the semiconductor substrate 10 as a source line and the bit line BL. At this time, for example, a ground potential is supplied to the channel layer 52, and a channel through which electrons flow is formed. When the channel is formed in the channel layer 52, electrons in the channel pass through the tunnel insulating layer 53 and are injected and accumulated in the charge accumulation layer 54. As a result, a threshold voltage Vth of the memory cell MC rises and "0" data is written.

When writing "1" data (for example, "L" level data) to the memory cell MC, the channel of the channel layer 52 is brought into a floating state, and "1" data is written by not injecting electrons into the charge accumulation layer 54.

When reading data from the memory cell MC, a read voltage is applied to the word line WL connected to the memory cell MC. The read voltage is a voltage at which the memory cell MC having "1" data is turned on and the memory cell MC having "0" data is not turned on. Further, a relatively high voltage is applied to the word line WL connected to the other memory cells MC in the memory string to which the memory cell MC to be read belongs to turn on all the other memory cells MC. In this state, when a cell current flows through the bit line BL, it means that "1" data has been read out, and when the cell current does not flow through the bit line BL, it means that "0" data has been read out.

In the above-described operation of the semiconductor memory device 1, a current (signal) can relatively preferentially flow in the low resistance band WLs being low resistance to the high resistance band WLd. As described above, the low resistance band WLs functions as a highway through which signals are exchanged at a high speed.

[Processing of Manufacturing Semiconductor Memory Device]

Next, an example of processing of manufacturing the semiconductor memory device 1 will be described with reference to FIGS. 3 to 9. FIGS. 3 to 9 are flow views illustrating an example of a procedure of processing of manufacturing the semiconductor memory device 1 according to the embodiment. In each of FIGS. 3 to 6, the upper view is a plan view of in particular the columnar structure 50 and a vicinity of the columnar structure 50 in the semiconductor memory device 1 in a middle of the manufacturing. In each of FIGS. 3 to 9, the lower view is a cross-sectional view of the semiconductor memory device 1 in the middle of the manufacturing.

Figure 3:
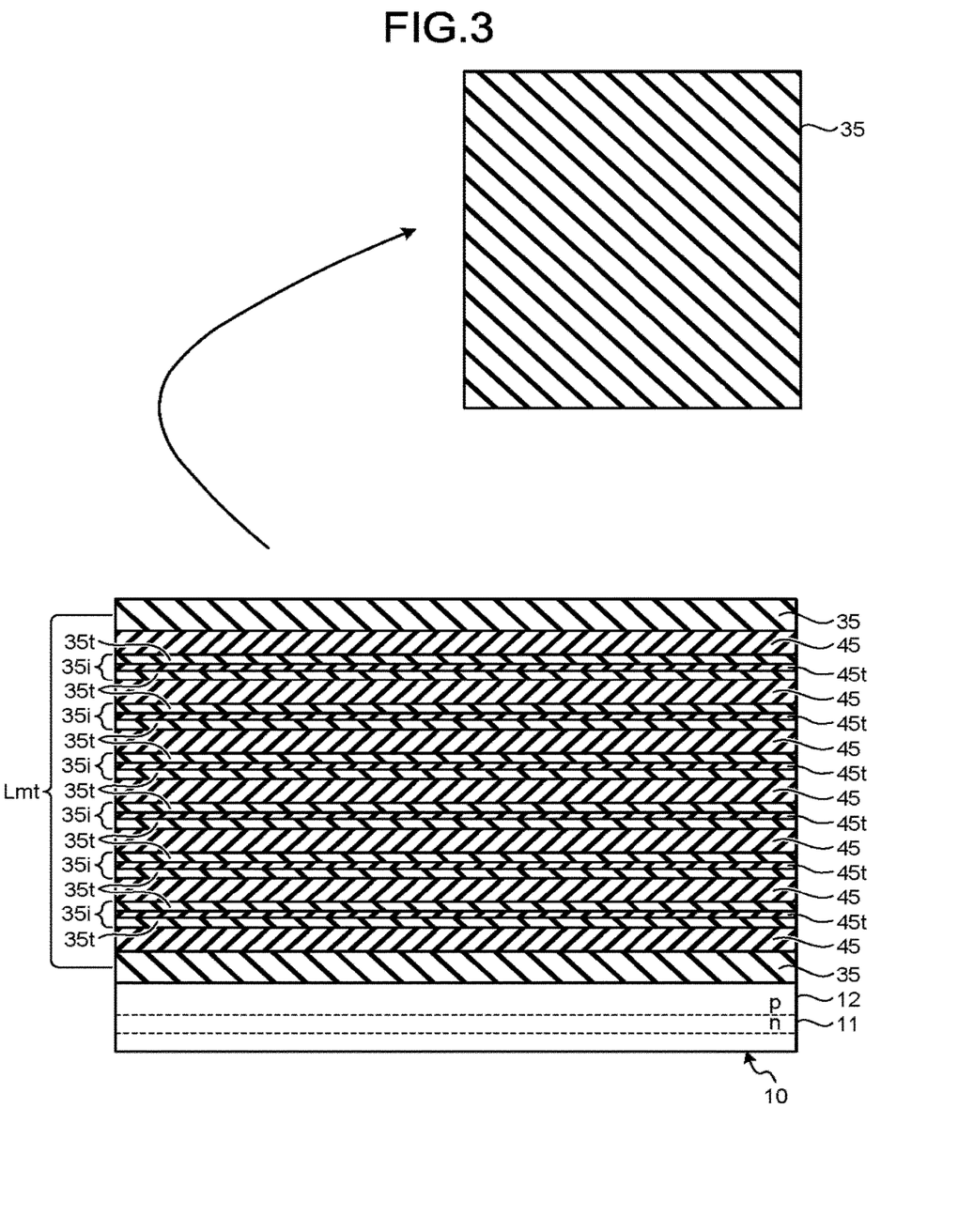
FIG. 3 is a flow view illustrating an example of a procedure of processing of manufacturing the semiconductor memory device according to the embodiment.

As illustrated in FIG. 3, a stacked body Lmt in which insulating layers 35$i$ and sacrificial layers 45 are alternately stacked is formed on the p well 12 of the semiconductor substrate 10 in which the n well 11, the p well 12, and the like are formed. The insulating layer 35$i$ has a stacked structure in which the thin layer 35$t$ made of $SiO_2$ and the like, a thin layer 45$t$ made of SiN and the like, and the thin layer 35$t$ are stacked in this order. The sacrificial layer 45 is an insulating layer made of SiN and the like and is a layer to be replaced with the conductive layer 25 later.

Note that, in the example of FIG. 3, the uppermost and lowermost layers are the insulating layers 35 without having the thin layer 45$t$. However, the uppermost and lowermost layers may be the insulating layers 35$i$ having the thin layer 45$t$ lie therein.

Figure 4:
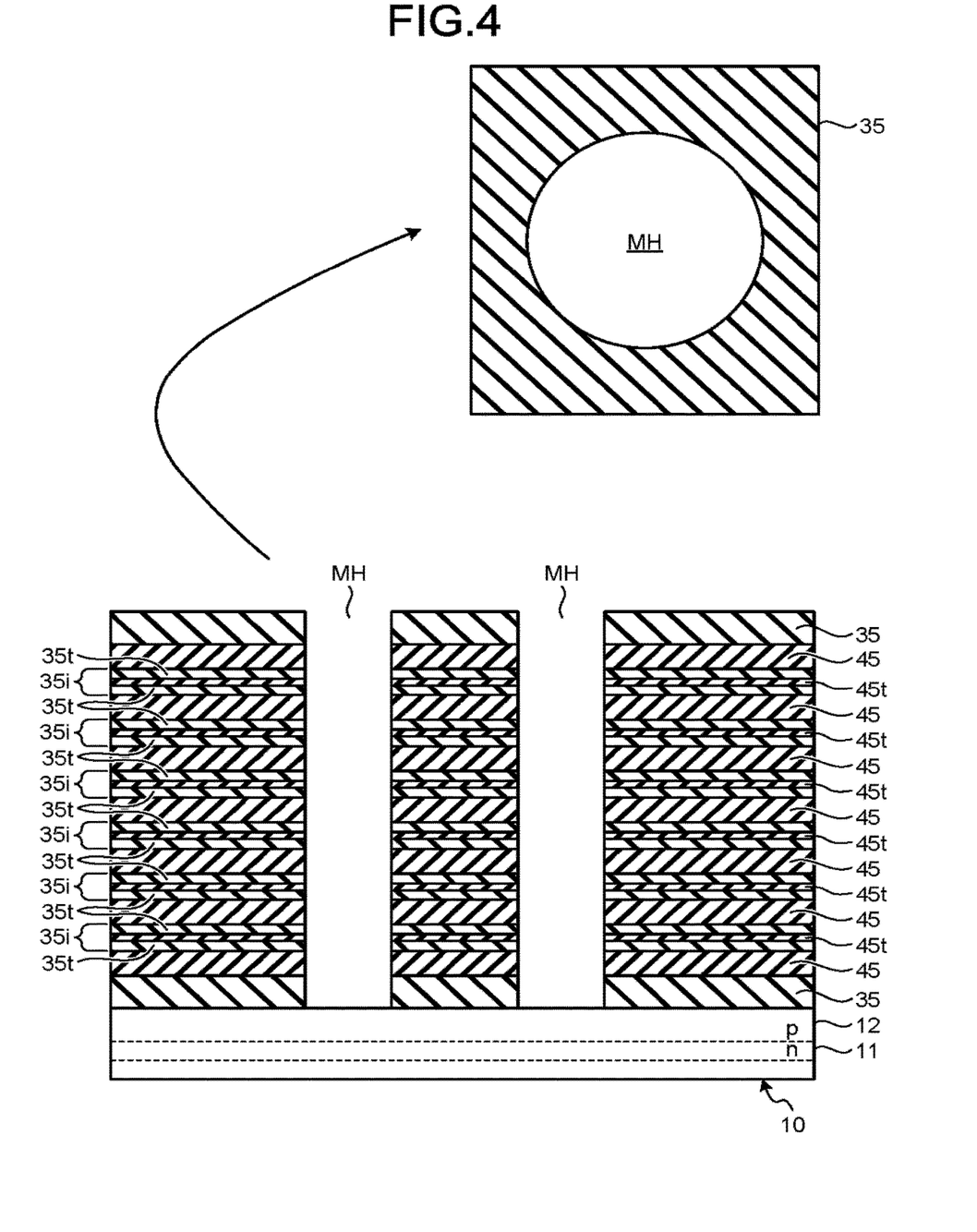
FIG. 4 is a flow view illustrating an example of a procedure of processing of manufacturing the semiconductor memory device according to the embodiment.

Next, as illustrated in FIG. 4, a memory hole MH penetrating the stacked structure of the insulating layers 35$i$ and the sacrificial layers 45 and reaching the semiconductor substrate 10 is formed. The memory hole MH is formed in a planned formation region of the columnar structure 50. The memory hole MH is not formed in a region where the slit ST is to be formed.

Figure 5:
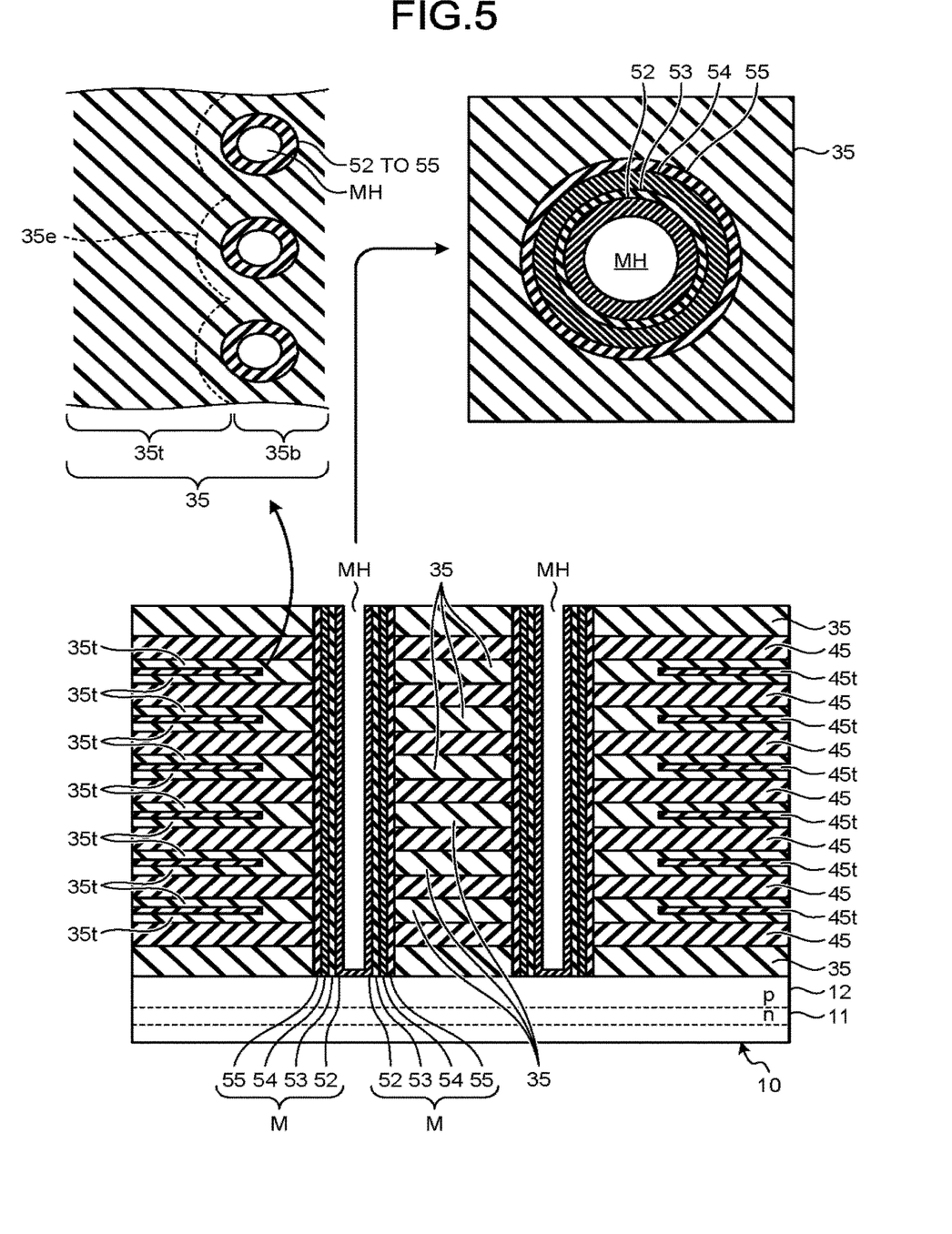
FIG. 5 is a flow view illustrating an example of a procedure of processing of manufacturing the semiconductor memory device according to the embodiment.

Next, as illustrated in FIG. 5, an insulating material is deposited in the memory hole MH to form the block insulating layer 55 on an inner wall of the memory hole MH. Further, an insulating material is deposited in the memory hole MH to form the charge accumulation layer 54 on the block insulating layer 55. Further, an insulating material is deposited in the memory hole MH to form the tunnel insulating layer 53 on the charge accumulation layer 54. Further, a semiconductor material is deposited in the memory hole MH to form the channel layer 52 on the tunnel insulating layer 53 and a bottom of the memory hole MH. Thereby, the memory layer M is formed in the memory hole MH.

Further, in the process of forming the memory layer M, the thin layer 45t near the memory hole MH is oxidized. With the oxidization, the entire insulating layer 35i in a layer thickness direction is altered to the insulating layer 35 made of $SiO_2$ and the like except a planned formation region of the slit ST without the memory hole MH and a peripheral region of the planned formation region of the slit ST. Thereby, the main body 35b of the insulating layer 35 without including the thin layer 45t is formed. At this time, since the alteration to the insulating layer 35 by the oxidation of the thin layer 45t occurs to expand outward from an outer edge portion of the memory layer M, the end portion 35e of the main body 35b of the insulating layer 35 has a wave shape in which arcs along an outer periphery of a row of the columnar structures 50 lie in a row in top view, as schematically illustrated in a part of the upper view in FIG. 5.

Figure 6:
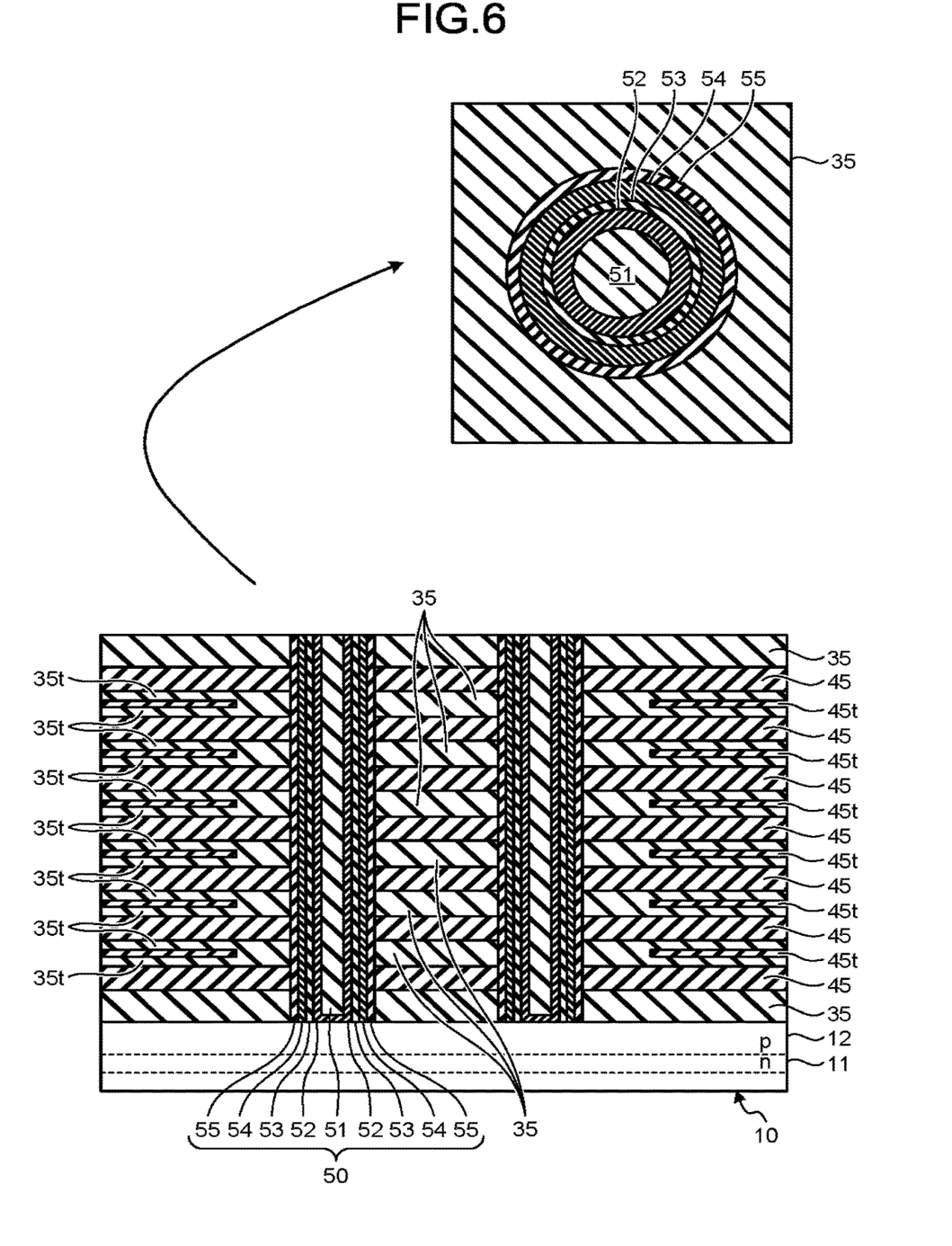
FIG. 6 is a flow view illustrating an example of a procedure of processing of manufacturing the semiconductor memory device according to the embodiment.

Next, as illustrated in FIG. 6, an insulating material is deposited or applied so that the memory hole MH is substantially completely filled to form the core portion 51 in a region surrounded by the channel layer 52. Thereby, the columnar structure 50 is formed.

Figure 7:
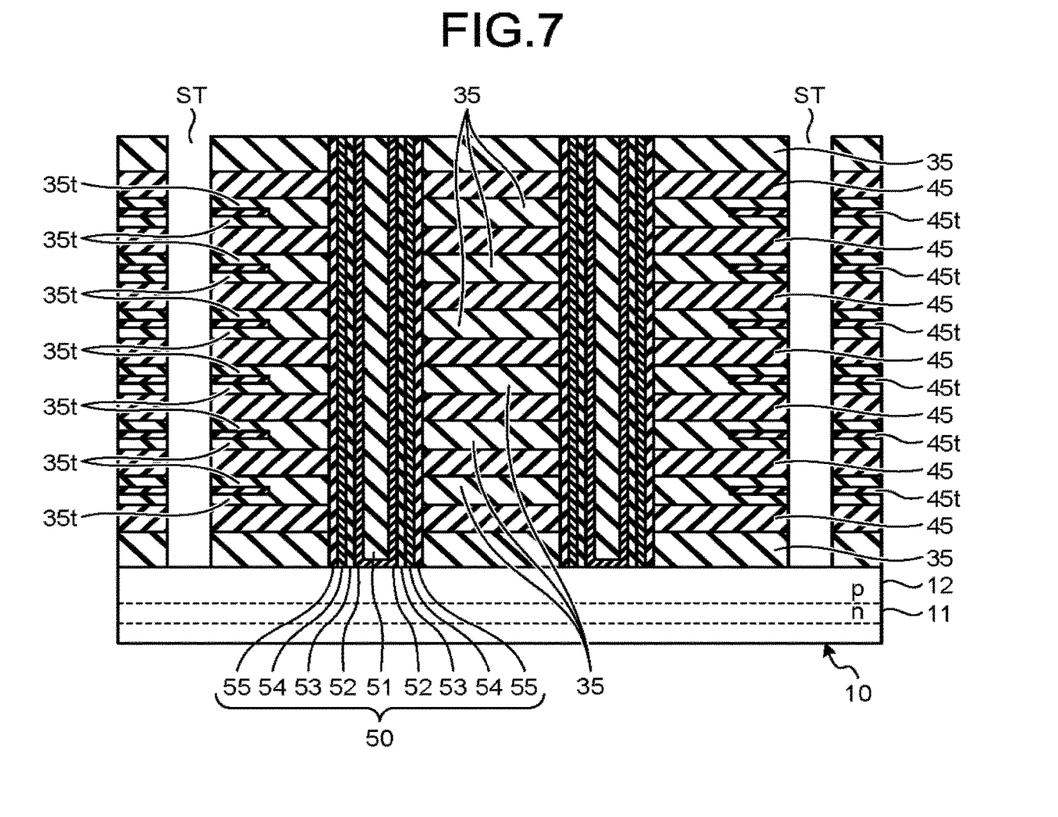
FIG. 7 is a flow view illustrating an example of a procedure of processing of manufacturing the semiconductor memory device according to the embodiment.

Next, as illustrated in FIG. 7, the slit ST penetrating the plurality of the thin layers 35t, 45t, and 35t of the insulating layers 35, and the sacrificial layers 45 and reaching the semiconductor substrate 10 is formed in an outer peripheral portion of the region where the columnar structure 50 is formed.

Figure 8:
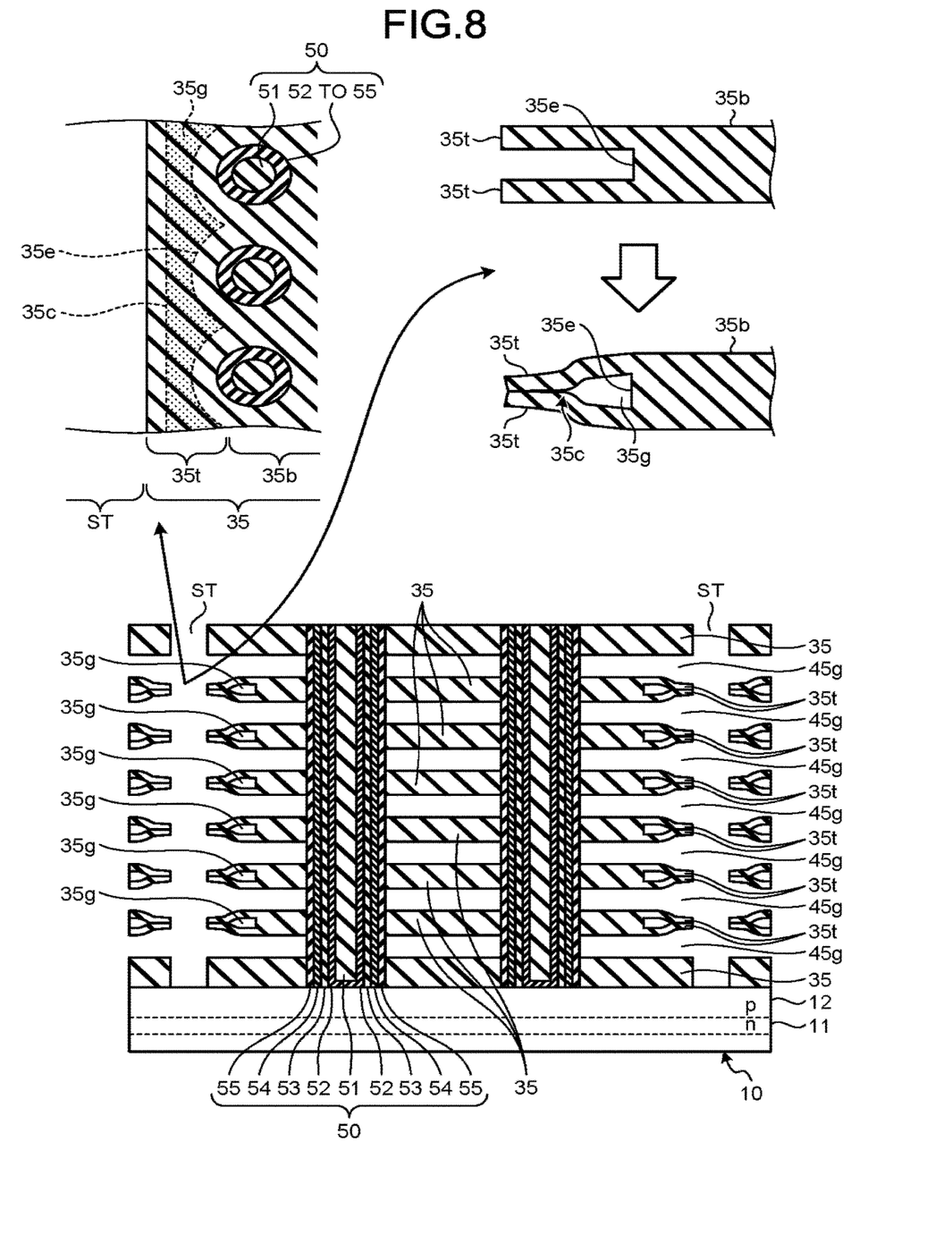
FIG. 8 is a flow view illustrating an example of a procedure of processing of manufacturing the semiconductor memory device according to the embodiment.

Next, as illustrated in FIG. 8, the sacrificial layer 45 and the thin layer 45t are removed via the slit ST. With the removal of the thin layer 45t, the thin layers 35t and 35t spaced from each other with a predetermined distance protrude from the end portion 35e of the main body 35b, the end portion 35e facing the slit ST, toward the slit ST. As a result, as illustrated in the upper enlarged view in FIG. 8, the end portion of the insulating layer 35 is supposed to have a U-shaped structure having the end portion 35e of the main body 35b as a bottom surface and the thin layers 35t and 35t opened toward the slit ST side as both end portions in section view. However, the thin layer 45t is thinner than the sacrificial layer 45 and the like, and the distance between the thin layers 35t and 35t spaced in a gap after the thin layer 45t is removed is also small. Therefore, surface tension at the time of drying chemicals used for removal of the thin layer 45t and electrostatic force after formation of the gap work between the thin layers 35t and 35t, and the tip end portions of the thin layers 35t and 35t adhere to each other, so that the U-shaped opened portion becomes a closed shape. Thereby, the air gap layer 35g is included in both end portions of the insulating layer 35. At this time, the tip end portions of the thin layers 35t and 35t are in plane contact when the distance by which the thin layers 35t and 35t extend is sufficiently long, and the tip end portions of the thin layers 35t and 35t are in point or line contact when the distance by which the thin layers 35t and 35t extend is short. Further, the blocked end 35c of the air gap layer 35g formed as the tip end portions of the thin layers 35t and 35t are in contact with each other has the substantially linear shape along the edge of the slit ST in top view.

Further, a gap 45g is formed between the insulating layers 35 from which the sacrificial layer 45 is removed. Since the thin layers 35t and 35t of the insulating layer 35 adjacent to the gap 45g have the closed shape, the gap 45g near the slit ST expands as compared with the gap 45g near the columnar structure 50.

Figure 9:
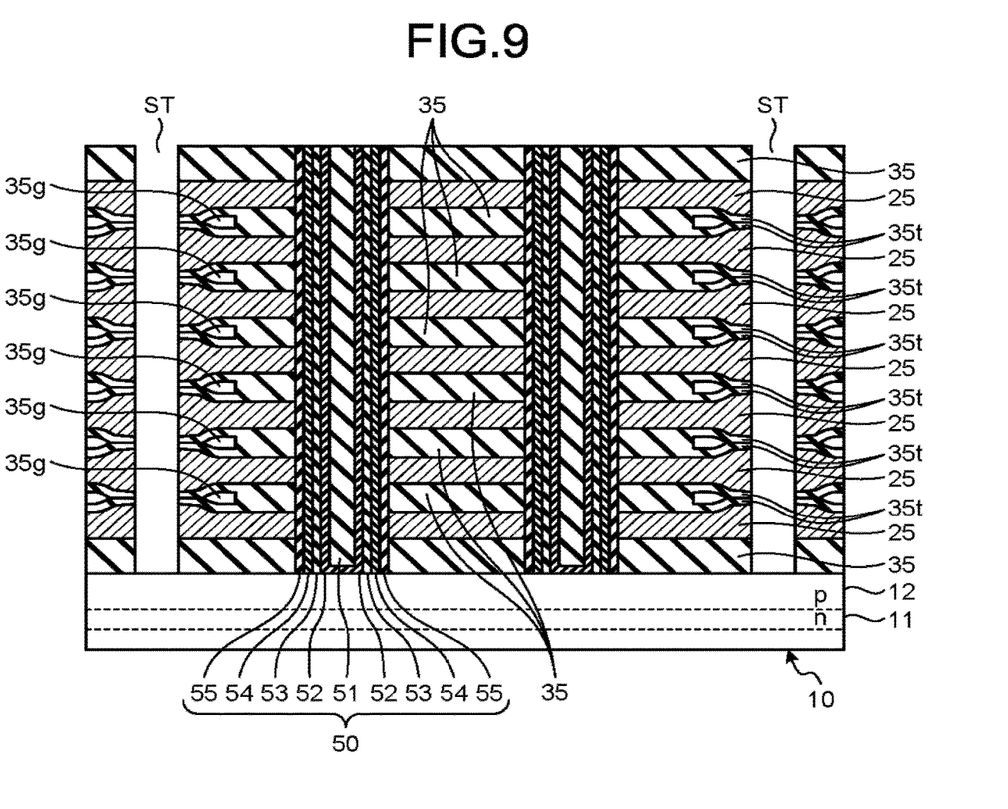
FIG. 9 is a flow view illustrating an example of a procedure of processing of manufacturing the semiconductor memory device according to the embodiment.

Next, as illustrated in FIG. 9, a conductive material is filled in the gap 45g through the slit ST. Thereby, the conductive layer 25 stacked between the insulating layers 35 is formed. Meanwhile, an end portion of the air gap layer 35g included in the insulating layer 35 is closed by the blocked end 35c formed as the tip end portions of the thin layers 35t and 35t are in contact with each other. Therefore, the air gap layer 35g is not filled with the conductive material. Further, the conductive material is filled thick in the gap 45g near the slit ST in the expanded state. In other words, the conductive layer 25 is formed to be thicker in a peripheral edge region in a direction orthogonal to the direction into which the conductive layer 25 itself extends as the word line WL than in a central portion.

The procedure in FIGS. 8 and 9 may be referred to as replacement with the conductive layer 25 or the like. After the slit ST is used for the replacement, the insulating layer 36 (see FIG. 2) is buried in the slit ST, for example. Alternatively, a conductive layer or the like may be buried in the slit ST and used as a source line contact or the like.

Thereafter, the conductive layer 27 to serve as the bit line BL is formed above the columnar structures 50 and is connected to the channel layer 52 of a predetermined columnar structure 50 via the contact 28.

Thereby, the semiconductor memory device 1 of the embodiment is manufactured.

According to the semiconductor memory device 1 of the embodiment, the connection ends of the thin layers 35t and 35t, the connection ends being connected with the main body 35b, the thin layers 35t and 35t extending from the end portion 35e of the main body 35b of the insulating layer 35, the end portion 35e facing the slit ST, are separated by a predetermined distance, and the tip end portions of the thin layers 35t and 35t have a closed structure.

Since the tip end portions of the thin layers 35t and 35t have the closed structure, the insulating layer 35 on the side of the slit ST includes the air gap layer 35g. The vicinity of the peripheral edge region of the word lines WL in which the air gap layer 35g lies is the low resistance band WLs where many signals are exchanged. The air gap layer 35g lies between the word lines WL serving as the low resistance band WLs to reduce an interline capacitance of the word lines WL, thereby to reduce a resistance-capacitance (RC) delay of the word line WL and improve the signal speed in the word line WL.

The tip end portions of the thin layers 35t and 35t have the closed structure, whereby the interval between the insulating layers 35 adjacent in the stacking direction of the stacked body Lm expands toward the side of the slit ST, and the word line WL on the side of the slit ST becomes thicker than the word line WL between the columnar structures 50. With the structure, the resistance of the low resistance band WLs can be further reduced. Further, the peripheral edge portion of the insulating layer 35, which is the tip end portions of the thin layers 35t and 35t, lies between the word lines WL increased in thickness and adjacent in the stacking direction of the stacked body Lm, whereby a decrease in withstand voltage between the adjacent word lines WL caused by sag in the peripheral edge region of the word lines WL is suppressed while having the air gap layer 35g lie therebetween.

The tip end portions of the thin layers 35t and 35t have the closed structure, whereby the gap 45g near the slit ST serving as the opening at the time of replacement has an expanded shape. With the structure, blockage of the opening before the gap 45g is completely filled with the conductive layer 25 can be suppressed. Therefore, insufficient filling with the conductive layer 25 is suppressed, and the resistance value of the entire word line WL can be reduced.

As described above, according to the semiconductor memory device 1 of the embodiment, the insulating layer 35 having the air gap layer 35g can be obtained by the extremely simple structure of the thin layers 35t and 35t with the closed tip end portions. Further, the insulating layer 35 with the expanded opening on the side of the slit ST can be obtained. Furthermore, the structure in which the word line WL on side of the slit ST is increased in thickness can be obtained. Further, by the simple manufacturing processing using the surface tension and the electrostatic force, the air gap layer 35g can be provided in the insulating layer 35, the opening of the insulating layer 35 on the side of the slit ST can be expanded, and further, the word line WL on the side of the slit ST can be increased in thickness.

Note that, in the semiconductor memory device 1 of the embodiment, the air gap layer 35g is included in the low resistance band WLs portion where the decrease in the interline capacitance of the word lines WL more effectively works, that is, in the insulating layer 35 near the slit ST. For example, the air gap layer is not allowed to lie in the insulating layer 35 in the region where the columnar structures 50 densely exist, which is a central portion of the stacked body Lm, whereby the signal speed in the word line WL can be improved while maintaining a stronger structure.

Further, in the semiconductor memory device 1 of the embodiment, the tip end portions of the thin layers 35t and 35t are in contact with each other at a position sandwiched by the conductive layers 25 adjacent in the stacking direction of the stacked body Lm without entering the slit ST. That is, the entire air gap layer 35g is also located in the region sandwiched by the conductive layers 25. In this way, the entire air gap layer 35g remains in the region sandwiched by the conductive layers 25 without entering the slit ST, so that the entire air gap layer 35g can be used to reduce the interline capacitance of the word lines WL.

Further, in the semiconductor memory device 1 of the embodiment, the end portion 35e of the main body 35b of the insulating layer 35 has the wave shape in which arcs along an outer periphery of a row of the columnar structures 50 lie in a row in top view. With the shape, the strength of the air gap layer 35g with respect to the stacking direction of the stacked body Lm can be increased. In other words, crushing of the air gap layer 35g in the stacking direction of the stacked body Lm can be suppressed.

Further, in the semiconductor memory device 1 of the embodiment, the tip end portions of the thin layers 35t and 35t constituting the air gap layer 35g are in plane contact with each other, for example. In this case, the surface tension and the electrostatic force further work between the thin layers 35t and 35t, and the adhesion between the thin layers 35t and 35t can be strengthened, and the insulating layer 35 including the air gap layer 35g can be more reliably constituted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a stacked body having a plurality of conductive layers and at least one insulating layer alternately stacked above a substrate;
   a plurality of pillars extending in a stacking direction of the stacked body to penetrate the stacked body;
   a plurality of memory cells arrayed in a height direction of the pillars; and
   a slit extending in the stacking direction of the stacked body to penetrate the stacked body, outside a region where the pillars are arranged, wherein
   an end portion of the insulating layer on a side of the slit has
   a main body of the insulating layer,
   a first thin layer thinner than the main body and extending from an end portion closer to an upper surface of the main body, the end portion facing the slit, toward the slit, and
   a second thin layer thinner than the main body and extending from an end portion closer to a lower surface of the main body, the end portion facing the slit, toward the slit,
   a connection end of the first thin layer, the connection end being connected with the main body, and a connection end of the second thin layer, the connection end being connected with the main body, are separated in the stacking direction of the stacked body,
   a tip end portion of the first thin layer, the tip end portion extending toward the slit, and a tip end portion of the second thin layer, the tip end portion extending toward the slit, are in contact with each other, and
   the insulating layer includes
   an air gap layer surrounded by the main body, the first thin layer, and the second thin layer, in the end portion on the side of the slit.

2. The semiconductor memory device according to claim 1, wherein
   the tip end portions of the first thin layer and the second thin layer are in contact with each other at a position sandwiched by the conductive layers adjacent in the stacking direction of the stacked body.

3. The semiconductor memory device according to claim 1, wherein
   the tip end portion of the first thin layer and the tip end portion of the second thin layer do not enter the slit.

4. The semiconductor memory device according to claim 1, wherein
   the entire air gap layer is arranged at a position sandwiched by the conductive layers adjacent in the stacking direction of the stacked body.

5. The semiconductor memory device according to claim 1, wherein
   the air gap layer does not exist in a region surrounded by the pillars.

6. The semiconductor memory device according to claim 1, wherein
   the tip end portions of the first thin layer and the second thin layer are in plane contact with each other.

7. The semiconductor memory device according to claim 1, wherein the end portion of the main body, the end portion facing the slit, has a wave shape in which arcs along an outer periphery of a row of the pillars proximity to the slit lie in a row in top view.

8. The semiconductor memory device according to claim 1, wherein
the end portion of the main body, the end portion facing the slit, is arranged with a substantially equal distance from an outer periphery of the pillars proximity to the slit.

9. The semiconductor memory device according to claim 1, wherein
portions of the conductive layers on the side of the slit is thicker than portions of the conductive layers between the pillars.

10. The semiconductor memory device according to claim 9, wherein
the portions of the conductive layers on the side of the slit become thicker toward the tip end portions contacting to each other of the first thin layer and the second thin layer.

11. The semiconductor memory device according to claim 1, wherein
one of the conductive layers has a band-like portion on the side of the slit extending in a band-like manner along the slit.

12. The semiconductor memory device according to claim 11, wherein
the one of the conductive layers has a mesh-like portion dotted with the pillars in the region where the pillars are arranged, and
the band-like portion is lower than the mesh-like portion in resistance.

13. The semiconductor memory device according to claim 1, wherein
an area per unit section in top view of the conductive layers on the side of the slit is larger than an area per unit section in top view of the conductive layers between the pillars.

14. A semiconductor memory device comprising:
a stacked body portion in which a plurality of conductive layers extending in a first direction is stacked above a substrate via an insulating layer; and
a plurality of pillars extending in a stacking direction of the stacked body portion to penetrate the stacked body portion and forming a plurality of memory cells at intersection portions between the plurality of pillars and the plurality of conductive layers, respectively, wherein
each of the plurality of conductive layers has
a thick layer portion thicker than a portion in a region where the plurality of pillars is arranged, in a peripheral edge region in a second direction intersecting with the first direction, and
the insulating layer has
a main body arranged in the region where the plurality of pillars is arranged,
a peripheral edge portion interposed between the thick layer portions of the plurality of conductive layers adjacent in the stacking direction, and
an air gap layer arranged between the main body and the peripheral edge portion in the second direction.

15. The semiconductor memory device according to claim 14, wherein
the insulating layer includes
a pair of thin layers respectively extending in a direction of the peripheral edge region from a portion closer to an upper surface and a portion closer to a lower surface in an end portion of the main body, the end portion facing the peripheral edge portion, and
the pair of thin layers
is separated from each other between the main body and the peripheral edge portion in the second direction and sandwiches the air gap layer from both sides in the stacking direction, and
is interposed between the thick layer portions in a state where the pair of thin layers is superimposed one another in the peripheral edge portion.

16. A method of manufacturing a semiconductor memory device, the method comprising:
forming a stacked body in which a plurality of sacrificial layers and at least one insulating layer are alternately stacked above a substrate and a thin layer to serve as a sacrificial material is interposed in the insulating layer;
forming a plurality of pillars penetrating the stacked body and altering the thin layer near the pillars;
forming a slit penetrating the stacked body outside a region where the pillars are arranged; and
removing a portion of the thin layer except the altered thin layer near the pillars and the sacrificial layers from a side of the slit, and bringing a pair of portions of the insulating layer adjacent via the portion of the thin layer in a stacking direction of the stacked body to adhere to each other at a position where the thin layer has been removed.

17. The method of manufacturing a semiconductor memory device according to claim 16, wherein
tip end portions of the pair of portions of the insulating layer are brought to plane-adhere to each other when removing the portion of the thin layer and the sacrificial layers.

18. The method of manufacturing a semiconductor memory device according to claim 17, wherein
tip end portions of the pair of portions of the insulating layer are brought to plane-adhere to each other while an air gap layer is formed in the insulating layer by separating portions other than the tip end portions of the pair of portions of the insulating layer from each other in the stacking direction when removing the portion of the thin layer and the sacrificial layers.

19. The method of manufacturing a semiconductor memory device according to claim 16, wherein
the thin layer is altered into a wave shape in which arcs along an outer periphery of a row of the pillars proximity to the slit lie in a row in top view when altering the thin layer near the pillars, and
the thin layer altered in the wave shape in top view is left without removing when removing the portion of the thin layer and the sacrificial layers.

20. The method of manufacturing a semiconductor memory device according to claim 16, further comprising:
filling a conductive material from the side of the slit into a gap caused by removing the sacrificial layers to form conductive layers stacked via the insulating layer, wherein
the gap caused by removing the sacrificial layers expands toward the side of the slit serving as an opening through which the conductive material is filled.

* * * * *